US012696702B2

(12) United States Patent
Shigenoi et al.

(10) Patent No.: US 12,696,702 B2

(45) Date of Patent: Jul. 28, 2026

(54) COMPOSITION FOR TREATING SEMICONDUCTOR AND METHOD FOR TREATING OBJECT TO BE TREATED

(71) Applicant: FUJIFILM Corporation, Tokyo (JP)

(72) Inventors: Yuta Shigenoi, Shizuoka (JP); Atsushi Mizutani, Shizuoka (JP); Tomonori Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 334 days.

(21) Appl. No.: 18/463,754

(22) Filed: Sep. 8, 2023

(65) Prior Publication Data

US 2023/0420266 A1 Dec. 28, 2023

Related U.S. Application Data

(63) Continuation of application No. PCT/JP2022/007928, filed on Feb. 25, 2022.

(30) Foreign Application Priority Data

Mar. 11, 2021 (JP) ................................ 2021-039567
Sep. 28, 2021 (JP) ................................ 2021-157994

(51) Int. Cl.
*H10P 50/66* (2026.01)

(52) U.S. Cl.
CPC .................................. *H10P 50/667* (2026.01)

(58) Field of Classification Search
CPC ........ H01L 21/32134; H01L 21/30608; C09K 13/00
USPC ........................................................ 438/745
See application file for complete search history.

(56) References Cited

U.S. PATENT DOCUMENTS

| | | | | |
|---|---|---|---|---|
| 2009/0218542 | A1 | 9/2009 | Isami et al. | |
| 2012/0267627 | A1 | 10/2012 | Barr et al. | |
| 2018/0037852 | A1 | 2/2018 | Thomas et al. | |
| 2019/0085240 | A1 | 3/2019 | Liu et al. | |
| 2020/0157422 | A1 | 5/2020 | Liu et al. | |
| 2020/0221578 | A1 * | 7/2020 | Chung | H05K 3/188 |
| 2020/0407636 | A1 | 12/2020 | Chung et al. | |

FOREIGN PATENT DOCUMENTS

| | | | | | |
|---|---|---|---|---|---|
| JP | 2009-206335 | A | | 9/2009 | |
| JP | 2010-174074 | A | | 8/2010 | |
| JP | 2012-238849 | A | | 12/2012 | |
| JP | 2013-135081 | A | | 7/2013 | |
| JP | 2018-177975 | A | | 11/2018 | |
| JP | 2019-050364 | A | | 3/2019 | |
| JP | 2019-218548 | A | | 12/2019 | |
| JP | 2020-088391 | A | | 6/2020 | |
| JP | 2021-009885 | A | | 1/2021 | |
| KR | 10-2013-0079151 | A | | 7/2013 | |
| KR | 20180069185 | A | * | 6/2018 | C11D 7/264 |
| KR | 10-2019-0022414 | A | | 3/2019 | |
| TW | 201920613 | A | | 6/2019 | |

OTHER PUBLICATIONS

EPA, Drinking Water Regulations and Contaminants (Year: 2025).*
Honeywell Research Chemicals, Water (Year: 2025).*
Communication dated Aug. 27, 2025 in Korean Application No. 10-2023-7030478.
International Search Report dated May 10, 2022 in International Application No. PCT/JP2022/007928.
Written Opinion dated May 10, 2022 in International Application No. PCT/JP2022/007928.
International Preliminary Report on Patentability (with translation of the Written Opinion) dated Sep. 12, 2023 in International Application No. PCT/JP2022/007928.
Communication dated Dec. 6, 2024 issued by the Korean Patent Office in application No. 10-2023-7030478.
Communication dated Oct. 7, 2025 in Japanese Application No. 2023-505286.
Taiwanese Office Action dated Nov. 28, 2025 in Application No. 111108249.
Office Action dated Apr. 30, 2026, issued in Taiwanese application No. 111108249.

* cited by examiner

*Primary Examiner* — Duy Vu N Deo
(74) *Attorney, Agent, or Firm* — Sughrue Mion, PLLC

(57) ABSTRACT

The present invention provides a composition for treating a semiconductor in which etching of silicon germanium is suppressed and a ratio of an etching rate of silicon to an etching rate of silicon germanium is large. In addition, the present invention provides a method for treating an object to be treated using a composition for treating a semiconductor. The composition for treating a semiconductor according to the present invention is a composition for treating a semiconductor including a quaternary ammonium salt having a hydroxyl group, a polar organic solvent, at least one nitrogen-containing compound selected from the group consisting of a compound represented by Formula (1), a compound represented by Formula (2), and salts thereof, and water, in which the mass ratio of the nitrogen-containing compound to the quaternary ammonium salt is 0.00001 to 0.1.

(1)

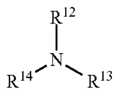

(2)

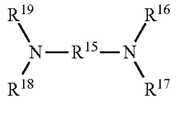

17 Claims, No Drawings

COMPOSITION FOR TREATING SEMICONDUCTOR AND METHOD FOR TREATING OBJECT TO BE TREATED

CROSS-REFERENCE TO RELATED APPLICATIONS

This application is a Continuation of PCT International Application No. PCT/JP2022/007928 filed on Feb. 25, 2022, which claims priority under 35 U.S.C. § 119(a) to Japanese Patent Application No. 2021-039567 filed on Mar. 11, 2021 and Japanese Patent Application No. 2021-157994 filed on Sep. 28, 2021. The above applications are hereby expressly incorporated by reference, in their entirety, into the present application.

BACKGROUND OF THE INVENTION

1. Field of the Invention

The present invention relates to a composition for treating a semiconductor and a method for treating an object to be treated.

2. Description of the Related Art

In a case of forming circuits and elements, it is common to carry out an etching process using a chemical liquid. In this case, since a plurality of materials may be present on a substrate, it is desirable that the chemical liquid used for etching is a chemical liquid capable of selectively removing only a specific material.

For example, JP2019-218548A discloses a cleaning off composition and a cleaning off process for very effectively cleaning off post-chemical-mechanical-polishing (CMP) residues and contaminants from surfaces of microelectronic devices without damaging low-k dielectric materials or copper interconnect materials.

SUMMARY OF THE INVENTION

In recent years, a semiconductor treatment process has been carried out in which only silicon (hereinafter, also simply referred to as "Si") is selectively etched from an object to be treated containing Si and silicon germanium (hereinafter, also simply referred to as "SiGe"). In this process, there is a demand for a composition and a treatment method that further improve a ratio of an etching rate of Si to an etching rate of SiGe and therefore selectively etch only Si.

In a case where Si is etched from an object to be treated containing Si and SiGe using the composition disclosed in JP2019-218548A, the present inventors have found that the etching rate of SiGe is high and the ratio of the etching rate of Si to the etching rate of SiGe is small, resulting in difficulty to selectively etch Si.

An object of the present invention is to provide a composition for treating a semiconductor in which etching of SiGe is suppressed and a ratio of an etching rate of Si to an etching rate of SiGe is large.

Another object of the present invention is to provide a method for treating an object to be treated using a composition for treating a semiconductor.

As a result of extensive studies to achieve the above objects, the present inventors have found that the objects can be achieved by the following configurations.

[1] A composition for treating a semiconductor, including a quaternary ammonium salt having a hydroxyl group, a polar organic solvent, at least one nitrogen-containing compound selected from the group consisting of a compound represented by Formula (1) which will be described later, a compound represented by Formula (2) which will be described later, and salts thereof, and water, in which a mass ratio of the nitrogen-containing compound to the quaternary ammonium salt is 0.00001 to 0.10.

[2] The composition for treating a semiconductor according to [1], in which a content of the nitrogen-containing compound is 0.0001% to 1.00% by mass with respect to a total mass of the composition for treating a semiconductor.

[3] The composition for treating a semiconductor according to [1] or [2], in which a content of the polar organic solvent is 15% to 85% by mass with respect to a total mass of the composition for treating a semiconductor.

[4] The composition for treating a semiconductor according to any one of [1] to [3], in which the composition contains two or more types of the polar organic solvents.

[5] The composition for treating a semiconductor according to any one of [1] to [4], in which the polar organic solvent has a hydroxyl group.

[6] The composition for treating a semiconductor according to any one of [1] to [5], in which the quaternary ammonium salt includes an ammonium cation represented by Formula (3) which will be described later or an ammonium cation represented by Formula (4) which will be described later.

[7] The composition for treating a semiconductor according to [6], in which the quaternary ammonium salt does not include an ammonium cation in which $R^1$, $R^3$, and $R^4$ in Formula (3) are methyl groups and $R^2$ in Formula (3) is an ethylene group.

[8] The composition for treating a semiconductor according to any one of [1] to [7], in which the quaternary ammonium salt includes at least one or more selected from the group consisting of dimethylbis(2-hydroxyethyl)ammonium hydroxide, methyltris(2-hydroxyethyl)ammonium hydroxide, 4-methyl-4-(2-hydroxyethyl)morpholinium hydroxide, and oxydiethylenebis[dimethyl(2-hydroxyethyl)ammonium hydroxide].

[9] The composition for treating a semiconductor according to any one of [1] to [8], in which the composition has a pH of 11.0 or more.

[10] The composition for treating a semiconductor according to any one of [1] to [9], further including a metal component containing at least one metal element selected from the group consisting of Cr, Fe, and Cu, in which a content of the metal element is 1 ppt by mass to 1 ppm by mass with respect to a total mass of the composition for treating a semiconductor.

[11] The composition for treating a semiconductor according to [10], in which a ratio of the content of the metal element to a content of the nitrogen-containing compound is $1\times10^{-7}$ to 1.

[12] The composition for treating a semiconductor according to any one of [1] to [11], further including a surfactant.

[13] The composition for treating a semiconductor according to [12], in which the surfactant is a nonionic surfactant having an HLB value of 12.0 to 15.0.

[14] The composition for treating a semiconductor according to any one of [1] to [13], in which the composition is used for treating an object to be treated containing silicon and silicon germanium.

[15] A method for treating an object to be treated, including bringing an object to be treated containing silicon and silicon germanium into contact with the composition for treating a semiconductor according to any one of [1] to [14] to remove the silicon.

According to an aspect of the present invention, it is possible to provide a composition for treating a semiconductor in which etching of SiGe is suppressed and a ratio of an etching rate of Si to an etching rate of SiGe is large.

According to another aspect of the present invention, it is possible to provide a method for treating an object to be treated using a composition for treating a semiconductor.

DESCRIPTION OF THE PREFERRED EMBODIMENTS

Hereinafter, the present invention will be described in more detail.

The following description of the configuration requirements is a representative embodiment of the present invention, and the present invention is not limited to such an embodiment.

Hereinafter, the meaning of each description in the present specification will be expressed.

Any numerical range expressed using "to" in the present specification refers to a range including the numerical values before and after the "to" as a lower limit value and an upper limit value, respectively.

"ppm" in the present specification is an abbreviation for "parts per million" and means $10^{-6}$. In addition, "ppb" is an abbreviation for "parts per billion" and means $10^{-9}$. "ppt" is an abbreviation for "parts per trillion" and means $10^{-12}$.

In the present specification, in a case where two or more types of a certain component are present, the "content" of the component means a total content of the two or more types of components.

The term "silicon" in the present specification refers to a material substantially composed only of Si element. The expression "substantially" means that the content of the Si element is 90% by mass or more with respect to the total mass of the material. Therefore, other elements (except Ge element) may be included as long as the content of the Si element is within the above range.

In addition, the term "silicon germanium" in the present specification refers to a material substantially composed only of Si element and Ge element. The expression "substantially" means that the total content of the Si element and the Ge element is 90% by mass or more with respect to the total mass of the material. Therefore, other elements may be included as long as the total content of the Si element and the Ge element is within the above range. In addition, in silicon germanium, the content ratio of the Si element to the Ge element is not particularly limited, and the mass percentage of the content of the Ge element to the total amount of the Si element and the Ge element is preferably 5% to 50% by mass.

Unless otherwise specified, the "exposure" includes exposure with a mercury lamp, a far ultraviolet ray represented by an excimer laser, an X-ray, or EUV light, and drawing with a particle beam such as an electron beam or an ion beam.

The "preparation" includes supplying a predetermined material by purchase or the like, in addition to providing a specific material by synthesis, combination, or the like.

With regard to a bonding direction of a divalent group (for example, —COO—), unless otherwise specified, in a case where Y in a compound represented by "X—Y—Z" is —COO—, the compound may be either of "X—O—CO—Z" or "X—CO—O—Z".

{Composition for Treating Semiconductor}

The composition for treating a semiconductor according to the embodiment of the present invention (hereinafter, also simply referred to as "composition") is a composition including a quaternary ammonium salt having a hydroxyl group, a polar organic solvent, at least one nitrogen-containing compound selected from the group consisting of a compound represented by Formula (1) which will be described later, a compound represented by Formula (2) which will be described later, and salts thereof, and water, in which the mass ratio of the nitrogen-containing compound to the quaternary ammonium salt is 0.00001 to 0.10.

Although the mechanism by which the foregoing objects are achieved by the composition having the above-mentioned configuration is not necessarily clear, the present inventors consider as follows.

It is presumed that the composition contains a quaternary ammonium salt and water to thereby exhibit an etching ability for both Si and SiGe, but the presence of a hydroxyl group in the quaternary ammonium salt suppresses only the etching of SiGe, thus making it possible to increase the ratio of the etching rate of Si to the etching rate of SiGe. Further, it is presumed that the inclusion of the nitrogen-containing compound in the composition such that the mass ratio of the nitrogen-containing compound to the quaternary ammonium salt having a hydroxyl group is 0.00001 to 0.10, and the inclusion of a polar organic solvent in the composition lead to further suppressed etching of SiGe, thus making it possible to increase the ratio of the etching rate of Si to the etching rate of SiGe, and therefore the required level can be satisfied.

Hereinafter, achieving at least one of the effect of being able to further suppress the etching of SiGe or the effect of being able to further increase the ratio of the etching rate of Si to the etching rate of SiGe is also referred to as "the effect of the present invention is more excellent".

[Components of Composition]

Hereinafter, components that can be contained in the composition will be described.

(Quaternary Ammonium Salt Having Hydroxyl Group)

The composition contains a quaternary ammonium salt having a hydroxyl group (hereinafter, also simply referred to as "specific quaternary ammonium salt").

Although the details are not clear, it is considered that the inclusion of the specific quaternary ammonium salt in the composition leads to suppressed etching of SiGe, thus making it possible to increase the ratio of the etching rate of Si to the etching rate of SiGe.

The specific quaternary ammonium salt includes an ammonium cation and an ammonium anion.

In the specific quaternary ammonium salt, it is preferable that the ammonium cation has a hydroxyl group.

The number of hydroxyl groups contained in the specific quaternary ammonium salt is not particularly limited and may be one or more. From the viewpoint that the effect of the present invention is more excellent, the number of hydroxyl groups is preferably 1 to 6, more preferably 1 to 4, and still more preferably 1 to 3.

The ammonium cation contained in the specific quaternary ammonium salt may be an ammonium cation containing one quaternized nitrogen atom, or may be an ammonium cation containing a plurality (two or more) of quaternized nitrogen atoms.

The specific quaternary ammonium salt preferably contains an ammonium cation represented by Formula (3) or an ammonium cation represented by Formula (4), from the viewpoint that the effect of the present invention is more excellent.

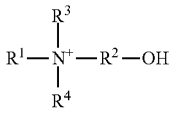
(3)

In Formula (3), $R^1$, $R^3$, and $R^4$ each independently represent an alkyl group having 1 to 16 carbon atoms which may have a substituent, and the alkyl group may have, as a substituent, one or more groups selected from the group consisting of a hydroxyl group and an —O— group.

The number of carbon atoms in the alkyl group of each of $R^1$, $R^3$, and $R^4$ is preferably 1 to 6, more preferably 1 to 4, and still more preferably 1 or 2, from the viewpoint that the effect of the present invention is more excellent.

In a case where the alkyl group has a hydroxyl group, the number of hydroxyl groups contained in the alkyl group is not particularly limited, and is preferably 1 to 3 and more preferably 1.

In a case where the alkyl group has an —O— group, the alkyl group may have an —O— group between the carbon atoms of the alkyl group, or may have an —O— group at the terminal of the alkyl group.

In a case where the alkyl group has an —O— group, the number of —O— groups contained in the alkyl group is not particularly limited, and is preferably 1 to 3 and more preferably 1.

Examples of $R^1$, $R^3$, and $R^4$ include a methyl group, a hydroxymethyl group, an ethyl group, a 2-hydroxyethyl group, a 2-ethoxyethanol group, a propyl group, a 2-hydroxypropyl group, a 3-hydroxypropyl group, a butyl group, a hexyl group, an octyl group, a decyl group, and a dodecyl group.

$R^2$ represents an alkylene group having 1 to 16 carbon atoms which may have an —O— group.

The number of carbon atoms in the alkylene group of $R^2$ is not particularly limited, and is preferably 1 to 6, more preferably 1 to 4, and still more preferably 1 or 2 from the viewpoint that the effect of the present invention is more excellent.

In a case where the alkylene group has an —O— group, the alkylene group may have an —O— group between the carbon atoms of the alkylene group, or may have an —O— group at the terminal of the alkylene group.

In a case where the alkylene group has an —O— group, the number of —O— groups contained in the alkylene group is not particularly limited, and is preferably 1 to 3 and more preferably 1.

Examples of $R^2$ include a methylene group, an ethylene group, a propylene group, an oxydimethylene group, an oxydiethylene group, a butylene group, and a hexylene group.

$R^1$ and $R^3$, $R^3$ and $R^4$, and $R^1$ and $R^4$ may be each independently bonded to each other to form a ring structure.

The type of the ring structure to be formed is not particularly limited and may be an aromatic ring or a non-aromatic ring.

In addition, the ring structure to be formed may contain heteroatoms (for example, an oxygen atom, a sulfur atom, and a nitrogen atom).

Examples of the ring structure to be formed include a morpholine ring and a piperidine ring.

Above all, from the viewpoint that the effect of the present invention is more excellent, it is preferable that at least one of $R^1$, $R^3$, or $R^4$ represents an alkyl group having a hydroxyl group and having 1 to 16 carbon atoms, or one of $R^1$ and $R^3$, $R^3$ and $R^4$, and $R^1$ and $R^4$ are bonded to each other to form a ring structure.

In addition, from the viewpoint that the effect of the present invention is more excellent, it is preferable that the specific quaternary ammonium salt does not include an ammonium cation in which $R^1$, $R^3$, and $R^4$ in Formula (3) are methyl groups and $R^2$ in Formula (3) is an ethylene group. In other words, it is preferable that the specific quaternary ammonium salt does not include choline.

Examples of the ammonium cation represented by Formula (3) include a trimethyl(2-hydroxyethyl)ammonium cation, a triethyl(2-hydroxyethyl)ammonium cation, a trimethyl(3-hydroxypropyl)ammonium cation, a trimethyl(4-hydroxybutyl)ammonium cation, dimethylbis(2-hydroxyethyl) ammonium cation, diethylbis(2-hydroxyethyl)ammonium cation, methyltris(2-hydroxyethyl)ammonium cation, tetra(2-hydroxyethyl)ammonium cation, and 4-methyl-4-(2-hydroxyethyl)morpholinium cation.

In addition, it is also preferable that all of $R^1$, $R^2$—OH, $R^3$, and $R^4$ are not the same group.

The phrase "all of $R^1$, $R^2$—OH, $R^3$, and $R^4$ are not the same group" means that at least two types of groups are included in the group consisting of four groups of $R^1$, $R^2$—OH, $R^3$, and $R^4$. Any of 2 to 4 types of groups may be included in the group consisting of four groups of $R^1$, $R^2$—OH, $R^3$, and $R^4$.

For example, in a case where both $R^1$ and $R^2$—OH are 2-hydroxyethyl groups and $R^3$ and $R^4$ are methyl groups, there are 2 types of groups included in the group consisting of four groups of $R^1$, $R^2$—OH, $R^3$, and $R^4$.

Groups with different numbers of carbon atoms, such as a methyl group and an ethyl group, are considered to be different types of groups. In addition, even in a case where the number of carbon atoms is the same, and then in a case where the bonding positions are different, such as an n-propyl group and an isopropyl group, in a case where the presence or absence of a substituent is different, such as an ethyl group and a 2-hydroxyethyl group, and in a case where the positions of the substituents are different, such as a 2-hydroxypropyl group and a 3-hydroxypropyl group, both are regarded as different groups. In this regard, in a case where one of $R^1$ and $R^3$, $R^3$ and $R^4$, and $R^1$ and $R^4$ are bonded to each other to form a ring structure, the groups forming the ring structure are assumed to be the same group.

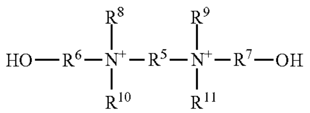
(4)

In Formula (4), $R^5$, $R^6$, and $R^7$ each independently represent an alkylene group having 1 to 16 carbon atoms which may have an —O— group.

The number of carbon atoms in the alkylene group of each of $R^5$, $R^6$, and $R^7$ is preferably 1 to 6, more preferably 1 to 4, and still more preferably 1 or 2, from the viewpoint that the effect of the present invention is more excellent.

In a case where the alkylene group has an —O— group, the alkylene group may have an —O— group between the carbon atoms of the alkylene group, or may have an —O— group at the terminal of the alkylene group.

In a case where the alkylene group has an —O— group, the number of —O— groups contained in the alkylene group is not particularly limited, and is preferably 1 to 3 and more preferably 1.

Specific examples of $R^5$, $R^6$, and $R^7$ are the same as the groups mentioned in $R^2$.

$R^8$, $R^9$, $R^{10}$, and $R^{11}$ each independently represent an alkyl group having 1 to 16 carbon atoms which may have a substituent, and the alkyl group may have, as a substituent, one or more groups selected from the group consisting of a hydroxyl group and an —O— group.

The number of carbon atoms in the alkyl group of each of $R^8$, $R^9$, $R^{10}$, and $R^{11}$ is preferably 1 to 6, more preferably 1 to 4, and still more preferably 1 or 2, from the viewpoint that the effect of the present invention is more excellent.

In a case where the alkyl group has a hydroxyl group, the number of hydroxyl groups contained in the alkyl group is not particularly limited, and is preferably 1 to 3 and more preferably 1.

In a case where the alkyl group has an —O— group, the alkyl group may have an —O— group between the carbon atoms of the alkyl group, or may have an —O— group at the terminal of the alkyl group.

In a case where the alkyl group has an —O— group, the number of —O— groups contained in the alkyl group is not particularly limited, and is preferably 1 to 3 and more preferably 1.

Specific examples of $R^1$, $R^9$, $R^{10}$, and $R^{11}$ are the same as the groups mentioned in $R^1$, $R^3$, and $R^4$.

The ammonium cation represented by Formula (4) may be, for example, an oxydiethylenebis[dimethyl(2-hydroxyethyl)ammonium] cation.

In addition, it is also preferable that all of $R^6$—OH, $R^7$—OH, and $R^8$ to $R^{11}$ are not the same group.

The phrase "all of $R^6$—OH, $R^7$—OH, and $R^8$ to $R^{11}$ are not the same group" means that at least two types of groups are included in the group consisting of six groups of $R^6$—OH, $R^7$—OH, and $R^8$ to $R^{11}$. Any of 2 to 6 types of groups may be included in the group consisting of six groups of $R^6$—OH, $R^7$—OH, and $R^8$ to $R^{11}$.

Specific examples of the different groups are the same as those in the phrase "all of $R^1$, $R^2$—OH, $R^3$, and $R^4$ are not the same group".

The anion contained in the specific quaternary ammonium salt is not particularly limited, and examples thereof include a hydroxide ion, a halide ion, a cyanide ion, an acetate ion, a trifluoroacetate ion, a hydrogen sulfate ion, a sulfate ion, a sulfite ion, a sulfonate ion, a thiosulfate ion, a carbonate ion, an oxalate ion, a hydrogen phosphate ion, and a phosphate ion. Above all, the anion is preferably a hydroxide ion or a halide ion, more preferably a hydroxide ion, a chloride ion, a fluoride ion, or a bromide ion, and still more preferably a hydroxide ion.

Examples of the specific quaternary ammonium salt include trimethyl(2-hydroxyethyl)ammonium hydroxide (also referred to as choline), trimethyl(2-hydroxyethyl)ammonium chloride, triethyl(2-hydroxyethyl)ammonium hydroxide, trimethyl(3-hydroxypropyl)ammonium hydroxide, trimethyl(4-hydroxybutyl)ammonium hydroxide, dimethylbis(2-hydroxyethyl)ammonium hydroxide, dimethylbis(2-hydroxyethyl)ammonium chloride, diethylbis(2-hydroxyethyl)ammonium hydroxide, methyltris(2-hydroxyethyl)ammonium hydroxide, tetra(2-hydroxyethyl)ammonium hydroxide, 4-methyl-4-(2-hydroxyethyl)morpholinium hydroxide, and oxydiethylenebis[dimethyl(2-hydroxyethyl)ammonium hydroxide].

Above all, the specific quaternary ammonium salt is preferably dimethylbis(2-hydroxyethyl)ammonium hydroxide, methyltris(2-hydroxyethyl)ammonium hydroxide, 4-methyl-4-(2-hydroxyethyl)morpholinium hydroxide, or oxydiethylenebis[dimethyl(2-hydroxyethyl)ammonium hydroxide], from the viewpoint that the effect of the present invention is more excellent.

The specific quaternary ammonium salts may be used alone or in combination of two or more thereof.

The content of the specific quaternary ammonium salt is not particularly limited, and is preferably 1.0% to 15.0% by mass, more preferably 3.0% to 12.0% by mass, and still more preferably 4.0% to 10.0% by mass with respect to the total mass of the composition, from the viewpoint that the effect of the present invention is more excellent.

In a case where two or more types of the specific quaternary ammonium salts are used, it is preferable that the total content of the two or more types of the specific quaternary ammonium salts is within the above range.

(Polar Organic Solvent)

The composition contains a polar organic solvent.

In the present specification, the polar organic solvent means an organic solvent that dissolves in an amount of 0.1 g or more in 100 g of water under a condition of 25° C. The polar organic solvent is usually liquid under a condition of 25° C.

The polar organic solvent is preferably miscible with water in a certain ratio.

Examples of the polar organic solvent include a glycol-based solvent, a glycol ether-based solvent, an alcohol-based solvent, a ketone-based solvent, an amide-based solvent, and a sulfur-containing solvent.

Examples of the glycol-based solvent include ethylene glycol, propylene glycol, diethylene glycol, dipropylene glycol, triethylene glycol, and tetraethylene glycol.

Examples of the glycol ether-based solvent include glycol monoether.

Examples of the glycol monoether include ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of the alcohol-based solvent include an alkanediol, an alkoxyalcohol, a saturated aliphatic monohydric alcohol, an unsaturated non-aromatic monohydric alcohol, an alcohol containing a ring structure, and an alcohol having an amino group (—$NH_2$).

Examples of the alkanediol include glycol, 2-methyl-1,3-propanediol, 1,3-propanediol, 2,2-dimethyl-1,3-propanediol, 1,4-butanediol, 1,3-butanediol, 1,2-butanediol, 2,3-butanediol, and pinacol.

Examples of the alkoxy alcohol include 3-methoxy-3-methyl-1-butanol, 3-methoxy-1-butanol, and 1-methoxy-2-butanol.

Examples of the saturated aliphatic monohydric alcohol include methanol, ethanol, n-propyl alcohol, isopropanol (isopropyl alcohol), 1-butanol, 2-butanol, isobutyl alcohol, tert-butyl alcohol, 2-pentanol, t-pentyl alcohol, and 1-hexanol.

Examples of the unsaturated non-aromatic monohydric alcohol include allyl alcohol, propargyl alcohol, 2-butenyl alcohol, 3-butenyl alcohol, and 4-penten-2-ol.

Examples of the alcohol containing a ring structure include tetrahydrofurfuryl alcohol, furfuryl alcohol, and 1,3-cyclopentanediol.

Examples of the alcohol having an amino group include methanolamine, monoethanolamine, and 1-amino-2-propanol.

Examples of the ketone-based solvent include acetone, methyl ethyl ketone, methyl isobutyl ketone, and cyclohexanone.

Examples of the amide-based solvent include N,N-dimethylformamide, 1-methyl-2-pyrrolidone, 2-pyrrolidinone, 1,3-dimethyl-2-imidazolidinone, 2-pyrrolidinone, formamide, N-methylformamide, acetamide, N-methylacetamide, N,N-dimethylacetamide, N-methylpropanamide, and hexamethylphosphoric triamide.

Examples of the sulfur-containing solvent include dimethyl sulfone, dimethyl sulfoxide, and sulfolane.

Among the polar organic solvents listed above, an alcohol-based solvent or a sulfur-containing solvent is preferable and monoethanolamine or dimethyl sulfoxide is more preferable, from the viewpoint that the effect of the present invention is more excellent.

The polar organic solvents may be used alone or in combination of two or more thereof. Above all, from the viewpoint that the effect of the present invention is more excellent, it is preferable that the composition contains two or more types of polar organic solvents. In a case where the composition contains two or more types of polar organic solvents, the type of the polar organic solvent is preferably 2 to 4 types and more preferably 2 types.

Above all, from the viewpoint that the effect of the present invention is more excellent, it is preferable that the composition contains a polar organic solvent having a hydroxyl group (for example, the alcohol-based solvent described above). For example, in a case where the composition contains two or more types of polar organic solvents, at least one polar organic solvent is preferably a polar organic solvent having a hydroxyl group. In addition, it is more preferable that the composition contains a polar organic solvent having no hydroxyl group and a polar organic solvent having a hydroxyl group.

The content of the polar organic solvent is not particularly limited, and is preferably 10% to 90% by mass, more preferably 15% to 85% by mass, and still more preferably 25% to 45% by mass with respect to the total mass of the composition, from the viewpoint that the effect of the present invention is more excellent.

In a case where two or more types of polar organic solvents are used, it is preferable that the total content of the two or more types of polar organic solvents is within the above range.

In a case where two types of polar organic solvents are used in combination, the mixing ratio of the two types of polar organic solvents is not particularly limited. Above all, from the viewpoint that the effect of the present invention is more excellent, in a case where the composition contains two types of polar organic solvents, a first polar organic solvent and a second polar organic solvent, the mass ratio of the second polar organic solvent to the first polar organic solvent is preferably 0.1 to 10, more preferably 0.3 to 3.3, and still more preferably 0.4 to 2.5.

(Nitrogen-Containing Compound)

The composition contains at least one nitrogen-containing compound selected from the group consisting of a compound represented by Formula (1), a compound represented by Formula (2), and salts thereof.

(1)

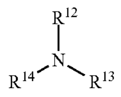

In Formula (1), $R^{12}$ represents an amino group ($-NH_2$) or an alkyl group having 1 to 16 carbon atoms which may have a substituent.

The number of carbon atoms in the alkyl group of $R^{12}$ is preferably 1 to 6, more preferably 1 to 4, and still more preferably 1 or 2, from the viewpoint that the effect of the present invention is more excellent.

Examples of the alkyl group represented by $R^{12}$ include a methyl group, an ethyl group, a propyl group, a butyl group, a hexyl group, an octyl group, a decyl group, and a dodecyl group.

$R^{13}$ and $R^{14}$ each independently represent a hydrogen atom or an alkyl group having 1 to 16 carbon atoms which may have a substituent, and the alkyl group may have, as a substituent, one or more groups selected from the group consisting of a hydroxyl group and an —O— group.

The number of carbon atoms in the alkyl group of each of $R^{13}$ and $R^{14}$ is preferably 1 to 6, more preferably 1 to 4, and still more preferably 1 or 2, from the viewpoint that the effect of the present invention is more excellent.

In a case where the alkyl group has a hydroxyl group, the number of hydroxyl groups contained in the alkyl group is not particularly limited, and is preferably 1 to 3 and more preferably 1.

In a case where the alkyl group has an —O— group, the alkyl group may have an —O— group between the carbon atoms of the alkyl group, or may have an —O— group at the terminal of the alkyl group.

In a case where the alkyl group has an —O— group, the number of —O— groups contained in the alkyl group is not particularly limited, and is preferably 1 to 3 and more preferably 1.

Specific examples of $R^{13}$ and $R^{14}$ are the same as the groups mentioned in $R^1$, $R^3$, and $R^4$.

$R^{12}$ and $R^{13}$, $R^{13}$ and $R^{14}$, and $R^{12}$ and $R^{14}$ may be each independently bonded to each other to form a ring structure.

The type of the ring structure to be formed is not particularly limited and may be an aromatic ring or a non-aromatic ring.

In addition, the ring structure to be formed may contain heteroatoms (for example, an oxygen atom, a sulfur atom, and a nitrogen atom).

Examples of the ring structure to be formed include a morpholine ring and a piperidine ring.

Examples of the compound represented by Formula (1) include hydrazine, monomethylhydrazine, 1,1-dimethylhydrazine, methylamine, ethylamine, dimethylamine, diethylamine, trimethylamine, triethylamine, N-methyldiethanolamine, N-ethyldiethanolamine, N,N-dimethylethanolamine, N-methylmorpholine, and N-ethylmorpholine.

Above all, from the viewpoint that the effect of the present invention is more excellent, the compound represented by Formula (1) is preferably hydrazine, trimethylamine, N-methyldiethanolamine, N,N-dimethylethanolamine, or N-methylmorpholine.

Examples of the salt of the compound represented by Formula (1) include a salt of the compound represented by Formula (1) with an inorganic acid, and a salt of the compound represented by Formula (1) with an organic acid.

Examples of the salt of the compound represented by Formula (1) with an inorganic acid include salts of the compound represented by Formula (1) with inorganic acids such as hydrochloric acid, nitric acid, sulfuric acid, phosphoric acid, hydrobromic acid, hydrofluoric acid, hydroiodic acid, and perchloric acid.

Examples of the salt of the compound represented by Formula (1) with an organic acid include salts of the compound represented by Formula (1) with organic acids such as acetic acid, trifluoroacetic acid, trichloroacetic acid, propionic acid, oxalic acid, maleic acid, citric acid, fumaric acid, lactic acid, malic acid, succinic acid, tartaric acid, gluconic acid, ascorbic acid, and methanesulfonic acid.

The salt of the compound represented by Formula (1) may be separated into a cation and an anion in the composition.

The molecular weight of the compound represented by Formula (1) is preferably 30 to 1,000, more preferably 30 to 500, and still more preferably 30 to 300.

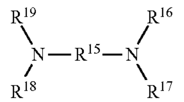

(2)

In Formula (2), $R^{15}$ represents an alkylene group which may have an —O— group.

The number of carbon atoms in the alkylene group of $R^{15}$ is not particularly limited, and is preferably 1 to 6 and more preferably 1 to 4 from the viewpoint that the effect of the present invention is more excellent.

In a case where the alkylene group has an —O— group, the alkylene group may have an —O— group between the carbon atoms of the alkylene group, or may have an —O— group at the terminal of the alkylene group.

In a case where the alkylene group has an —O— group, the number of —O— groups contained in the alkylene group is not particularly limited, and is preferably 1 to 3 and more preferably 1.

Specific examples of $R^{15}$ are the same as the groups mentioned in $R^2$.

$R^{16}$, $R^{17}$, $R^{18}$, and $R^{19}$ each independently represent an alkyl group having 1 to 16 carbon atoms which may have a substituent, and the alkyl group may have, as a substituent, one or more groups selected from the group consisting of a hydroxyl group and an —O— group.

The number of carbon atoms in the alkyl group of each of $R^{16}$, $R^{17}$, $R^{18}$, and $R^{19}$ is preferably 1 to 6, more preferably 1 to 4, and still more preferably 1 or 2.

In a case where the alkyl group has a hydroxyl group, the number of hydroxyl groups contained in the alkyl group is not particularly limited, and is preferably 1 to 3 and more preferably 1.

In a case where the alkyl group has an —O— group, the alkyl group may have an —O— group between the carbon atoms of the alkyl group, or may have an —O— group at the terminal of the alkyl group.

In a case where the alkyl group has an —O— group, the number of —O— groups contained in the alkyl group is not particularly limited, and is preferably 1 to 3 and more preferably 1.

Specific examples of $R^{16}$, $R^{17}$, $R^{18}$, and $R^{19}$ are the same as the groups mentioned in $R^1$, $R^3$, and $R^4$.

Examples of the compound represented by Formula (2) include N,N,N',N'-tetramethylmethylenediamine, N,N,N',N'-tetramethylethylenediamine, N,N,N',N'-tetrakis(2-hydroxypropyl)ethylenediamine, N,N,N',N'-tetrakis(2-hydroxyethyl)ethylenediamine, bis(2-dimethylaminoethyl) ether, and N-(2-hydroxyethyl)-N,N',N'-trimethylbis(2-aminoethyl)ether.

Above all, the compound represented by Formula (2) is preferably bis(2-dimethylaminoethyl)ether from the viewpoint that the effect of the present invention is excellent.

Examples of the salt of the compound represented by Formula (2) include a salt of the compound represented by Formula (2) with an inorganic acid, and a salt of the compound represented by Formula (2) with an organic acid.

Examples of the salt of the compound represented by Formula (2) with an inorganic acid include salts of the compound represented by Formula (2) with inorganic acids such as hydrochloric acid, nitric acid, sulfuric acid, phosphoric acid, hydrobromic acid, hydrofluoric acid, hydroiodic acid, and perchloric acid.

Examples of the salt of the compound represented by Formula (2) with an organic acid include salts of the compound represented by Formula (2) with organic acids such as acetic acid, trifluoroacetic acid, trichloroacetic acid, propionic acid, oxalic acid, maleic acid, citric acid, fumaric acid, lactic acid, malic acid, succinic acid, tartaric acid, gluconic acid, ascorbic acid, and methanesulfonic acid.

The salt of the compound represented by Formula (2) may be separated into a cation and an anion in the composition.

The molecular weight of the compound represented by Formula (2) is preferably 90 to 1,000, more preferably 90 to 500, and still more preferably 90 to 300.

The mass ratio of the nitrogen-containing compound to the specific quaternary ammonium salt is 0.00001 to 0.10. From the viewpoint that the effect of the present invention is more excellent, the mass ratio is preferably 0.0001 to 0.10 and more preferably 0.001 to 0.10.

The content of the nitrogen-containing compound is not particularly limited, and is preferably 0.00001% to 2.00% by mass, more preferably 0.0001% to 1.00% by mass, and still more preferably 0.01% to 0.50% by mass with respect to the total mass of the composition, from the viewpoint that the effect of the present invention is more excellent.

(Water)

The composition contains water.

The water is preferably water that has been subjected to a purification treatment, such as distilled water, ion exchange water, and ultrapure water, and more preferably ultrapure water used for producing semiconductors. The water contained in the composition may contain a tiny amount of components that are unavoidably mixed in.

The content of water is not particularly limited, and is preferably 4% to 85% by mass, more preferably 30% to 70% by mass, and still more preferably 40% to 50% by mass with respect to the total mass of the composition, from the viewpoint that the effect of the present invention is more excellent.

(Optional Components)

The composition may contain optional components in addition to the components described above.

Examples of the optional components include a metal component, a basic compound, an acidic compound, a surfactant, and a corrosion inhibitor.

Hereinafter, the optional components that may be contained in the composition will be described in detail.

<Metal Component>

The composition may contain a metal component containing at least one metal element selected from the group consisting of Cr, Fe, and Cu (hereinafter, also simply referred to as "specific metal component").

The specific metal component is selected from the group consisting of a metal particle and a metal ion.

The metal particle may be either of a single substance or an alloy.

The specific metal component may be any of a metal component that is unavoidably contained in each component (raw material) contained in the composition, a metal component that is unavoidably contained in one or more steps selected from the group consisting of production, storage, and transportation of the composition, and a metal component that is intentionally added.

Examples of the metal element contained in the specific metal component include metal elements selected from the group consisting of Cr, Fe, and Cu.

The content of the metal element contained in the specific metal component is not particularly limited, and is preferably 1 ppt by mass to 1 ppm by mass with respect to the total mass of the composition, from the viewpoint that the effect of the present invention is more excellent.

The ratio of the content of the metal element contained in the specific metal component to the content of the nitrogen-containing compound is not particularly limited, and is preferably $1 \times 10^7$ to 1 from the viewpoint that the effect of the present invention is more excellent.

<Basic Compound>

The composition may contain a basic compound.

The basic compound is a compound that is alkaline (having a pH of more than 7.0) in an aqueous solution.

Examples of the basic compound include an organic base, an inorganic base, and salts thereof.

In this regard, the basic compound does not include the above-mentioned specific quaternary ammonium salt and the above-mentioned nitrogen-containing compound.

Examples of the organic base include a quaternary ammonium salt, an alkylamine compound or a salt thereof, an amine oxide compound, a nitro compound, a nitroso compound, an oxime compound, a ketoxime compound, an aldoxime compound, a lactam compound, and an isocyanide compound.

In this regard, the quaternary ammonium salt as the optional component is a compound different from the above-mentioned specific quaternary ammonium salt. In addition, the alkylamine compound as the optional component is a compound different from the above-mentioned nitrogen-containing compound.

Examples of the inorganic base include alkali metal hydroxides such as sodium hydroxide and potassium hydroxide, alkaline earth metal hydroxides, and ammonia or salts thereof.

The content of the basic compound is not particularly limited, and is preferably 0.1% by mass or more and more preferably 0.5% by mass or more with respect to the total mass of the composition. The upper limit of the content of the basic compound is not particularly limited, and is preferably 20.0% by mass or less with respect to the total mass of the composition.

It is also preferable to adjust the content of the basic compound within the above suitable range so that the pH of the composition falls into a suitable range which will be described later.

<Acidic Compound>

The composition may contain an acidic compound.

The acidic compound is a compound that is acidic (having a pH of less than 7.0) in an aqueous solution.

Examples of the acidic compound include an inorganic acid, an organic acid, and salts thereof.

Examples of the inorganic acid include sulfuric acid, hydrochloric acid, phosphoric acid, nitric acid, hydrofluoric acid, perchloric acid, hypochlorous acid, and salts thereof.

Examples of the organic acid include carboxylic acid, sulfonic acid, and salts thereof.

Examples of the carboxylic acid include lower (having 1 to 4 carbon atoms) aliphatic monocarboxylic acids such as formic acid, acetic acid, propionic acid, and butyric acid, and salts thereof.

Examples of the sulfonic acid include methanesulfonic acid, benzenesulfonic acid, p-toluenesulfonic acid (tosylic acid), and salts thereof.

The content of the acidic compound is not particularly limited, and is preferably 0.1% by mass or more and more preferably 0.5% by mass or more with respect to the total mass of the composition. The upper limit of the content of the acidic compound is not particularly limited, and is preferably 20.0% by mass or less with respect to the total mass of the composition.

It is also preferable to adjust the content of the acidic compound within the above suitable range so that the pH of the composition falls into a suitable range which will be described later.

<Surfactant>

The composition may contain a surfactant.

The surfactant is not particularly limited as long as it is a compound having a hydrophilic group and a hydrophobic group (lipophilic group) in one molecule. Examples of the surfactant include an anionic surfactant, a cationic surfactant, and a nonionic surfactant.

Examples of the hydrophobic group contained in the surfactant include an aliphatic hydrocarbon group, an aromatic hydrocarbon group, and a combination thereof.

In a case where the hydrophobic group contains an aromatic hydrocarbon group, the number of carbon atoms in the hydrophobic group is preferably 6 or more and more preferably 10 or more.

In a case where the hydrophobic group does not contain an aromatic hydrocarbon group and is composed only of an aliphatic hydrocarbon group, the number of carbon atoms in the hydrophobic group is preferably 8 or more and more preferably 10 or more.

The upper limit of the number of carbon atoms in the hydrophobic group is not particularly limited, and is preferably 24 or less and more preferably 20 or less.

The surfactant is also preferably a nonionic surfactant having a hydrophilic-lipophilic balance (HLB) value of 12.0 to 15.0, which is described after paragraph [0029] of JP2021-009885A. In that case, the HLB value is preferably 12.5 to 14.0 and more preferably 12.5 to 13.5.

The HLB value is a value representing a degree of affinity of the surfactant for water and water-insoluble organic compounds. Typically, the HLB value is defined by Expression (G).

$$\text{HLB value}=20\times\text{formula weight of hydrophilic part of surfactant/molecular weight of surfactant} \quad \text{Expression G:}$$

Examples of the surfactant include polyoxyalkylene alkyl ether, polyoxyalkylene alkyl phenyl ether, polyoxyethylene fatty acid ester, polyoxyethylene sorbitan fatty acid ester, polyoxyethylene sorbitol fatty acid ester, glycerin fatty acid ester, and triethanolamine oleate.

The content of the surfactant is not particularly limited, and is preferably 10 ppm by mass or more and more preferably 30 ppm by mass or more with respect to the total mass of the composition. The upper limit of the content of the surfactant is not particularly limited, and is preferably 10% by mass or less and more preferably 5% by mass or less with respect to the total mass of the composition, from the viewpoint of suppressing foaming of the composition.

<Corrosion Inhibitor>

The composition may contain a corrosion inhibitor.

The corrosion inhibitor is added to the composition for the purpose of preventing etching of other materials present on the object to be treated.

The type of the corrosion inhibitor is appropriately selected depending on the material type of other materials present on the object to be treated.

Examples of the corrosion inhibitor include an amine compound, an imine compound, a thiol compound, and a thioether compound. Above all, the corrosion inhibitor is preferably an imine compound and more preferably a nitrogen-containing unsaturated heterocyclic compound.

Examples of the nitrogen-containing unsaturated heterocyclic compound include pyridine, triazine, imidazole, benzimidazole, purine, xanthine, and derivatives thereof.

The content of the corrosion inhibitor is not particularly limited, and is preferably 0.1% by mass or more and more preferably 1% by mass or more with respect to the total mass of the composition. The upper limit of the content of the corrosion inhibitor is not particularly limited, and is preferably 10% by mass or less and more preferably 5% by mass or less with respect to the total mass of the composition.

[Characteristics of Composition]

Hereinafter, the chemical properties and physical properties exhibited by the composition will be described.

(pH)

The pH of the composition is not particularly limited, and is preferably 11 or more.

From the viewpoint that the effect of the present invention is more excellent, the suitable pH range of the composition is preferably 11.0 to 15.0, more preferably 12.0 to 15.0, and still more preferably 13.0 to 14.5.

In the present specification, the pH of the composition is obtained by measuring pH at 25° C. using a pH meter (F-51: trade name, manufactured by HORIBA, Ltd.).

(Coarse Particles)

It is preferable that the composition is substantially free of coarse particles.

The "coarse particle" means a particle having a diameter of 0.2 m or more in a case where the shape of the particle is regarded as a sphere. In addition, the phrase "is substantially free of coarse particles" means that the number of particles having a diameter of 0.2 m or more in 1 mL of the composition is 10 or less in a case where the composition is subjected to measurement using a commercially available measuring device in a light scattering type in-liquid particle measuring method. The lower limit of the number of coarse particles in the composition is preferably 0 or more.

The coarse particles contained in the composition correspond to, for example, particles such as dust, dirt, organic solids, and inorganic solids contained as impurities in raw materials, and particles such as dust, dirt, organic solids, and inorganic solids brought in as contaminants during the preparation of the composition, in which those particles are finally present as particles without being dissolved in the composition.

The method of measuring the content of the coarse particles may be, for example, a method of measuring the content of the coarse particles in a liquid phase using a commercially available measuring device in a light scattering type in-liquid particle measuring method using a laser as a light source.

The method of removing the coarse particles may be, for example, a filtering treatment.

[Method for Producing Composition]

For example, a known production method can be used as the method for producing a composition.

The method for producing a composition may include one or more steps selected from the step group consisting of a composition preparation step, a filtration step, and a static neutralization step.

Hereinafter, the steps that can be included in the step of producing a composition will be described in detail. In addition, a container for accommodating the composition will also be described in detail.

It is preferable that each of the steps in the method for producing a composition is carried out in a clean room.

The clean room preferably satisfies the 14644-1 clean room standards. In addition, the clean room preferably satisfies any of International Organization for Standardization (ISO) class 1, ISO class 2, ISO class 3, or ISO class 4, more preferably ISO class 1 or ISO class 2, and still more preferably ISO class 1.

(Composition Preparation Step)

The composition preparation step may be, for example, a method in which components of a specific quaternary ammonium salt, a polar organic solvent, a nitrogen-containing compound, water, and optional components are prepared, and then the components are mixed to prepare a composition. In the composition preparation step, the order in which the components are mixed is not particularly limited.

In addition, the composition may be produced by producing a concentrated solution having a lower solvent content of one or more solvents selected from the group consisting of a polar organic solvent, water, and the like than the solvent content of the concentrated solution at the time of use, and diluting the concentrated solution with a diluent (a polar organic solvent or water, or both a polar organic solvent and water) at the time of use to adjust the content of each component to a predetermined content. The composition may also be produced by diluting the concentrated solution with a diluent and then adjusting the pH of the concentrated solution to a preset pH value using a basic compound or an acidic compound. In a case of diluting the concentrated solution, a predetermined amount of the diluent may be added to the concentrated solution or a predetermined amount of the concentrated solution may be added to the diluent.

(Filtration Step)

The method for producing a composition may include a filtration step of filtering the composition in order to remove foreign matters, coarse particles, and the like from the composition.

The filtering method may be, for example, a known filtration method, among which filtering using a filter is preferable.

The filter used for filtering include, for example, filters used for known filtering.

Examples of the material constituting the filter include a fluororesin such as polytetrafluoroethylene (PTFE), a polyamide resin such as nylon, and a polyolefin resin (including a high density polyolefin resin and an ultra high molecular weight polyolefin resin) such as polyethylene or polypropylene (PP), among which a polyamide resin, PTFE, or polypropylene (including high density polypropylene) is preferable.

In a case of using a filter composed of the above-mentioned materials, it is possible to more effectively remove foreign matters having high polarity, which are likely to cause defects, from the composition.

The critical surface tension of the filter is preferably 70 mN/m or more. The upper limit of the critical surface tension of the filter is preferably 95 mN/m or less. Above all, the critical surface tension of the filter is more preferably 75 to 85 mN/m.

The value of the critical surface tension is a nominal value of a manufacturer.

In a case of using a filter having a critical surface tension in the above range, it is possible to more effectively remove foreign matters having high polarity, which are likely to cause defects, from the composition.

The pore diameter of the filter is preferably 0.001 to 1.0 m, more preferably 0.02 to 0.5 m, and still more preferably 0.01 to 0.1 m. In a case where the pore diameter of the filter is within the above range, fine foreign matters can be removed from the composition while suppressing filter clogging.

The filter may be a combination of two or more types of filters.

The filtering using a first filter may be carried out once or twice or more.

In a case where filtering is carried out twice or more by combining a first filter and a second filter different from the first filter, each filter may be the same or different, and is preferably different. It is preferable that the first filter and the second filter differ from each other in at least one of the pore diameter or the constituent material.

It is preferable that the filter pore diameter of the second and subsequent filtering is the same as or smaller than the filter pore diameter of the first filtering. In addition, the first filters having different pore diameters may be combined within the above range of the pore diameters of the filters. With regard to the pore diameters of the filter, reference can be made to nominal values of filter manufacturers.

Examples of the filter include filters manufactured by Nihon Pall Ltd., Advantec Toyo Roshi Kaisha, Ltd., Nihon Entegris G. K., and Kitz Micro Filter Corporation.

Specific examples of the filter include P-NYLON FILTER made of polyamide (pore diameter: 0.02 μm, critical surface tension: 77 mN/m, manufactured by Nihon Pall Ltd.), PE CLEAN FILTER made of high density polyethylene (pore diameter: 0.02 μm, manufactured by Nihon Pall Ltd.), and PE CLEAN FILTER made of high density polyethylene (pore diameter: 0.01 μm, manufactured by Nihon Pall Ltd.).

The second filter may be, for example, a filter formed of the same material as the first filter.

The pore diameter of the second filter may be the same as the pore diameter of the first filter.

In a case where the pore diameter of the second filter is smaller than the pore diameter of the first filter, the ratio of the pore diameter of the second filter to the pore diameter of the first filter (pore diameter of second filter/pore diameter of first filter) is preferably 0.01 to 0.99, more preferably 0.1 to 0.9, and still more preferably 0.3 to 0.9. In a case where the pore diameter of the second filter is within the above range, fine foreign matters mixed in the composition can be further removed.

For example, filtering of the composition may be carried out in such a manner that filtering using the first filter is carried out with a mixed liquid containing a part of components of the composition, and after mixing the remaining components with the mixed liquid to prepare the composition, filtering using the second filter is carried out.

The filters used are preferably subjected to a washing treatment prior to filtering the composition.

The washing treatment is preferably a washing treatment using a liquid, and more preferably a washing treatment using a composition and a liquid containing components contained in the composition.

The temperature of the composition during filtering is preferably room temperature (25° C.) or lower, more preferably 23° C. or lower, and still more preferably 20° C. or lower. The lower limit of the temperature of the composition during filtering is preferably 0° C. or higher, more preferably 5° C. or higher, and still more preferably 10° C. or higher.

In a case where the temperature of the composition during filtering is within the above temperature range, the amounts of particulate foreign matters and impurities contained in the composition are reduced, so that the filtering can be carried out more efficiently.

(Static Neutralization Step)

The method for producing a composition may further include a static neutralization step of statically neutralizing the composition.

(Container)

For example, a known container can be used as the container for accommodating the composition.

It is preferable that the container has a high degree of cleanliness in the container for use in semiconductors and less elution of impurities.

Examples of the container include "CLEAN BOTTLE" series (manufactured by Aicello Corporation) and "PURE BOTTLE" (manufactured by Kodama Plastics Co., Ltd.). In addition, from the viewpoint of preventing the incorporation (contamination) of impurities into the raw materials and the composition, it is also preferable to use a multi-layer container in which an inner wall of the container has a six-layer structure consisting of six types of resins, or a multi-layer container in which an inner wall of the container has a seven-layer structure consisting of seven types of resins.

Examples of the multi-layer container include the containers described in JP2015-123351A, the contents of which are incorporated herein by reference.

Examples of the material for the inner wall of the container include a first resin of at least one selected from the group consisting of a polyethylene resin, a polypropylene resin, and a polyethylene-polypropylene resin, a second resin different from the first resin, and a metal such as stainless steel, Hastelloy, Inconel, or Monel. In addition, it is preferable that the inner wall of the container is formed of or coated with the above-mentioned materials.

The second resin is preferably a fluororesin (perfluororesin).

In a case where a fluororesin is used, elution of an oligomer of ethylene or propylene can be suppressed.

Examples of the container include a FluoroPure PFA composite drum (manufactured by Entegris, Inc.), and the containers described on page 4 of JP1991-502677A (JP-H-03-502677A), page 3 of WO2004/016526A, and pages 9 and 16 of WO1999/046309A.

For example, quartz and an electropolished metal material (a metal material subjected to electropolishing) in addition to the fluororesin are also preferable as the inner wall of the container.

The metal material used for the electropolished metal material is preferably a metal material containing at least one selected from the group consisting of chromium (Cr) and nickel (Ni), in which the total content of Cr and Ni is more than 25% by mass with respect to the total mass of the metal material. Examples of such a metal material include stainless steel and a Ni—Cr alloy.

The total content of Cr and Ni in the metal material is preferably 25% by mass or more and more preferably 30% by mass or more with respect to the total mass of the metal material. The upper limit of the total content of Cr and Ni is preferably 90% by mass or less with respect to the total mass of the metal material.

Examples of the stainless steel include known stainless steel.

Above all, stainless steel containing 8% by mass or more of Ni is preferable, and austenite-based stainless steel containing 8% by mass or more of Ni is more preferable.

Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), and SUS316L (Ni content: 12% by mass, Cr content: 16% by mass).

Examples of the Ni—Cr alloy include known Ni—Cr alloys.

Above all, a Ni—Cr alloy having a Ni content of 40% to 75% by mass and a Cr content of 1% to 30% by mass is preferable.

Examples of the Ni—Cr alloy include Hastelloy, Monel, and Inconel. Specific examples of the Ni—Cr alloy include Hastelloy C-276 (Ni content: 63% by mass, Cr content: 16% by mass), Hastelloy C-4 (Ni content: 60% by mass, Cr content: 17% by mass), and Hastelloy C-22 (Ni content: 61% by mass, Cr content: 22% by mass).

The Ni—Cr alloy may further contain boron, silicon, tungsten, molybdenum, copper, or cobalt in addition to Ni and Cr, if necessary.

Examples of the method for electropolishing a metal material include known methods.

Specific examples of the method for electropolishing a metal material include the methods described in paragraphs [0011] to [0014] of JP2015-227501A and paragraphs [0036] to [0042] of JP2008-264929A, the contents of which are incorporated herein by reference.

The metal material is preferably subjected to buffing.

Examples of the buffing method include known methods.

The size of abrasive grains used for finishing the buffing is preferably #400 or less from the viewpoint that the unevenness on the surface of the metal material is likely to be further reduced. The buffing is preferably carried out before the electropolishing.

The metal material may be subjected to one of a plurality of stages of buffing with different sizes or the like of abrasive grains, acid washing, magnetic fluid polishing, and the like, or a combination of two or more treatments thereof.

It is preferable to wash the inside of the container before filling with the composition.

The liquid used for washing can be appropriately selected depending on the intended use, and is preferably a liquid containing a composition or at least one of the components added to the composition.

The inside of the container may be purged with an inert gas (for example, nitrogen or argon) having a purity of 99.99995% by volume or more from the viewpoint of preventing changes in the components of the composition during the storage. In particular, a gas having a low moisture content is preferable. In addition, in a case where the container accommodating the composition is transported and stored, the transport and storage may be carried out at normal temperature or under temperature control. Above all, from the viewpoint of preventing deterioration, it is preferable to control the temperature in a range of −20° C. to 20° C.

{Use}

The composition is used in a semiconductor treatment. More specifically, the composition is preferably for a semiconductor device.

The phrase "for a semiconductor device" means that the composition is used in the production of a semiconductor device.

The composition can also be used in a step for producing a semiconductor device and can be used for treating, for example, a material composed of silicon, an insulating film, a resist film, an antireflection film, an etching residue, an ashing residue (hereinafter, also simply referred to as "residue"), and the like, which are present on a substrate. The composition may be used for treating a substrate after chemical mechanical polishing. In particular, the composition is preferably used for the treatment of an object to be treated containing Si and SiGe (hereinafter, also simply referred to as "object to be treated").

{Object to be Treated}

The object to be treated contains Si and SiGe.

The object to be treated is not particularly limited as long as it contains Si and SiGe, but Si and SiGe are usually disposed on the substrate.

Here, the expression "on the substrate" includes any aspect of front and back surfaces, side surfaces, and inside of grooves of the substrate.

In addition, the phrase "Si and SiGe are disposed on the substrate" includes the case where Si and SiGe are directly present on the surface of the substrate and the case where Si and SiGe are present on the substrate through another layer.

In addition, the phrase "Si and SiGe are arranged on the substrate" means that Si and SiGe are present in any form as long as Si and SiGe are present on the substrate at the same time. For example, Si and SiGe may be in contact with each other or may be in contact with each other through another layer or member. In addition, there may be a form in which Si and SiGe are not in contact with each other, although Si and SiGe are present on the same substrate.

The substrate is not particularly limited, and examples thereof include a metal substrate, a semiconductor substrate, a conductive substrate other than the metal substrate, a metal oxide substrate, a glass substrate, and a resin substrate. Above all, a semiconductor substrate is preferable.

Examples of the semiconductor substrate include a semiconductor wafer, a glass substrate for a photo mask, a glass substrate for liquid crystal display, a glass substrate for plasma display, a substrate for field emission display (FED), a substrate for an optical disk, a substrate for a magnetic disk, and a substrate for a magneto-optical disk.

Examples of the material constituting the semiconductor substrate include silicon, a Group III-V compound such as GaAs, and a combination thereof.

Examples of the use of the object to be treated include a dynamic random access memory (DRAM), a ferroelectric random access memory (FRAM: registered trademark), a magnetoresistive random access memory (MRAM), a phase change random access memory (PRAM), a logic circuit, and a processor.

The form of Si or SiGe on the substrate may be any form of film-like arrangement, wiring-like arrangement, plate-like arrangement, column-like arrangement, and particle-like arrangement.

The object to be treated may contain a layer and/or a structure as desired, in addition to Si and SiGe.

For example, one or more members selected from the group consisting of a metal wire, a gate electrode, a source electrode, a drain electrode, an insulating layer, a ferromagnetic layer, and a non-magnetic layer may be disposed on the substrate.

The substrate may include an exposed integrated circuit structure.

Examples of the integrated circuit structure include interconnection mechanisms such as a metal wire and a dielectric material. Examples of metals and alloys used for the interconnection mechanism include aluminum, a copper-aluminum alloy, copper, nickel, nickel silicide, cobalt, cobalt silicide, ruthenium, platinum, gold, titanium, tantalum, tungsten, silicon, titanium nitride, and tantalum nitride. The substrate may include one or more layers of materials selected from the group consisting of silicon oxide, silicon nitride, silicon carbide, and carbon-doped silicon oxide.

{Method for Treating Object to be Treated}

The method for treating an object to be treated according to the embodiment of the present invention (hereinafter, also referred to as "the present treatment method") includes a step A of bringing an object to be treated containing Si and SiGe into contact with the above-mentioned composition. Si in the object to be treated is selectively etched by carrying out the present treatment method.

The object to be treated used in the present treatment method is as described above.

Examples of the method of bringing the object to be treated into contact with the composition include a method of immersing the object to be treated in the composition placed in a tank, a method of spraying the composition onto the object to be treated, a method of causing the composition to flow on the object to be treated, and a combination thereof, among which a method of immersing the object to be treated in the composition is preferable.

Furthermore, a mechanical stirring method may also be used in order to further enhance the washing ability of the composition.

Examples of the mechanical stirring method include a method of circulating the composition on the object to be treated, a method of flowing or spraying the composition on the object to be treated, and a method of stirring the composition by ultrasonic or megasonic waves.

The treatment time of the step A can be appropriately adjusted.

The treatment time (contact time between the composition and the object to be treated) is preferably 0.25 to 10 minutes and more preferably 0.5 to 2 minutes.

The temperature of the composition during the treatment is preferably 20° C. to 100° C. and more preferably 40° C. to 80° C.

<Other Steps>

The present treatment method may include other steps in addition to the step A.

Examples of those other steps include a step of forming each of one or more structures selected from the group consisting of a metal wire, a gate structure, a source structure, a drain structure, an insulating layer, a ferromagnetic layer, a non-magnetic layer, and the like (for example, layer formation, etching, chemical mechanical polishing, and modification), a step of forming resist, an exposure step, a removing step, a heat treatment step, a washing step, and an inspection step.

The present treatment method may be carried out at any stage of a back-end process (BEOL: back end of the line), a middle process (MOL: middle of the line), and a front-end process (FEOL: front end of the line), and is preferably carried out in a front-end process or a middle process.

EXAMPLES

Hereinafter, the present invention will be described in more detail with reference to Examples.

The materials, amounts of materials used, proportions, treatment details, treatment procedure, and the like shown in Examples given below can be appropriately modified without departing from the spirit and scope of the present invention. Accordingly, the scope of the present invention should not be construed as being limited to Examples given below.

{Preparation of Composition}

In Example 1, dimethylbis(2-hydroxyethyl)ammonium hydroxide as a specific quaternary ammonium salt, dimethyl sulfoxide and monoethanolamine as polar organic solvents, and hydrazine as a nitrogen-containing compound were added to ultrapure water so that the contents shown in Table 1 were obtained to form a mixed liquid, and then the mixed liquid was sufficiently stirred with a stirrer to adjust the pH to obtain a composition of Example 1.

Compositions of Examples 2 to 27 and compositions of Comparative Examples 1 to 4 were prepared in the same manner as in Example 1, except that the type and amount of each component were changed according to Table 1 or Table 2.

The symbol of "-" described in the table indicates that the component was not added. In addition, in a case where a plurality of compounds are described in the same column among columns in which compounds are described, it indicates that both compounds were added. The contents in that case are as described in order on the right side of the column.

In each composition, the contents of various components are as described in the table. In this regard, the content of water is the remainder of each composition. In addition, the pH exhibited by each composition is also as described in the table.

With regard to various components shown in the table, components all classified into a semiconductor grade or components all classified into a high-purity grade equivalent to the semiconductor grade were used.

In addition, the concentrations of the metal elements Cr, Fe, and Cu in the composition were appropriately adjusted by adding these components to the composition or subjecting the composition to a filtration treatment to achieve the values shown in the table.

[Components]

Hereinafter, each component used in the preparation of each composition will be shown.

(Quaternary Ammonium Salt Having Hydroxyl Group)

Dimethylbis(2-hydroxyethyl)ammonium hydroxide

Methyltris(2-hydroxyethyl)ammonium hydroxide

4-Methyl-4-(2-hydroxyethyl)morpholinium hydroxide

Oxydiethylenebis[dimethyl(2-hydroxyethyl)ammonium hydroxide]

Choline: trimethyl(2-hydroxyethyl)ammonium hydroxide (Comparative Example) TMAH: tetramethylammonium hydroxide (Polar Organic Solvent)

DMSO: dimethyl sulfoxide

WA: monoethanolamine

Sulfolane (Nitrogen-Containing Compound)

Hydrazine

Trimethylamine

N,N-dimethylethanolamine

N-methyldiethanolamine

N-methylmorpholine

Bis(2-dimethylaminoethyl)ether (Water)

Ultrapure water (Additives)

Corrosion inhibitor: xanthine

Surfactant 1: "TDK9" (trade name, manufactured by Oriental Union Chemical Corporation, HLB value: 13.3)

Surfactant 2: "TDK12" (trade name, manufactured by Oriental Union Chemical Corporation, HLB value: 14.5)

Surfactant 3: "Triton (trademark) CF10" (trade name, manufactured by The Dow Chemical Company, HLB value: 12.6)

Surfactant 4: "TDK40" (trade name, manufactured by Oriental Union Chemical Corporation, HLB value: 18.0)

Surfactant 5: "Triton (trademark) CF12" (trade name, manufactured by The Dow Chemical Company, HLB value: 10.6)

Surfactant 6: benzyldodecyldimethylammonium chloride

Surfactant 7: "PIONIN MA-1600" (trade name, manufactured by Takemoto Oil & Fat Co., Ltd.)

{Evaluation}

Various evaluation methods will be described in detail below.

[pH]

The pH of the composition was obtained by measuring pH at 25° C. using a pH meter (F-51: trade name, manufactured by HORIBA, Ltd.).

[Contents of Cr, Fe, and Cu]

The amounts of the metal elements Cr, Fe, and Cu contained in the composition were measured under the following measurement conditions.

The compositions of each Example and each Comparative Example were measured using an Agilent 8800 triple quadrupole ICP-MS (for semiconductor analysis, Option #200).

(Measurement Conditions)

The sample introduction system used was a quartz torch, a coaxial perfluoroalkoxyalkane (PFA) nebulizer (for self-suction), and a platinum interface cone. The measurement parameters of cool plasma conditions are as follows.

Radio frequency (RF) output (W): 600

Carrier gas flow rate (L/min): 0.7

Makeup gas flow rate (L/min): 1

Sampling depth (mm): 18

[Etching Rate]

The evaluation of the etching rate of SiGe (ER(SiGe)) and the ratio of the etching rate of Si to the etching rate of SiGe (ERR(Si/SiGe)) exhibited by the composition was carried out by the following procedure.

A SiGe layer (mass ratio: Si/Ge=4/1) was formed on a commercially available 12-inch silicon wafer by heteroepitaxy, and a chip cut into a 2 cm square from the wafer was obtained as a test piece.

The thickness of the SiGe layer on the obtained test piece was measured using a spectroscopic ellipsometer ("Vase", manufactured by J.A. Woollam Japan, Co., Inc.).

The test piece was placed in a container filled with the composition of each Example or each Comparative Example, and the composition was stirred to carry out an etching treatment for 20 minutes. The temperature of the composition was 40° C.

After the etching treatment, the test piece was dried with a nitrogen blow, and the thickness of the SiGe layer was measured with a spectroscopic ellipsometer. ER(SiGe) (Å/min) was calculated from the change in the thickness of the SiGe layer before and after the etching treatment.

The same test was carried out using a Si layer in place of the SiGe layer and a silicon germanium wafer in place of the silicon wafer, ER(Si) (Å/min) was calculated, and then ERR(Si/SiGe) was calculated.

ER(SiGe) and ERR(Si/SiGe) were evaluated according to the following evaluation standards. The evaluation results are shown in Table 1 or Table 2.

ER(SiGe) preferably has a small value, and ERR(Si/SiGe) preferably has a large value.

(Evaluation Standards of ER(SiGe))

A: Less than 10 Å/min

B: 10 Å/min or more and less than 20 Å/min

C: 20 Å/min or more and less than 30 Å/min

D: 30 Å/min or more (Evaluation Standards of ERR(Si/SiGe))

A: 30 or more

B: 20 or more and less than 30

C: 10 or more and less than 20

D: less than 10

[Defect Suppressibility]

Evaluation of the defect suppressibility in a case where the treatment was carried out using the composition was carried out by the following method.

While rotating a silicon wafer, 0.5 mL of each composition was spin-discharged onto the surface of the silicon wafer.

After the silicon wafer was spin-dried, the number of defects present on the silicon wafer was measured using a surface inspection device (SP-5, manufactured by KLA Corporation).

The defect suppressibility was evaluated according to the following evaluation standards. The evaluation results are shown in Table 1 or Table 2.

<Evaluation Standards of Defect Suppressibility>

A: The number of defects on the silicon wafer is less than 1,000

B: The number of defects on the silicon wafer is 1,000 or more.

In some of Examples which will be described later, the number of defects on the silicon wafer was 1,000 or more, but the defect suppressibility of the composition was at a practically acceptable level.

In the table, each description represents the following.

"Content" of each component represents the content (% by mass) of each component with respect to the total mass of the composition.

"B/A" in the nitrogen-containing compound column represents the ratio of the mass of the nitrogen-containing compound to the mass of the specific quaternary ammonium salt.

"C/B" in the metal component column represents the ratio of the mass of the metal component to the mass of the nitrogen-containing compound.

In the numerical values in the "B/A" and "C/B" columns, the notation of "E−n" means "$\times 10^{-n}$" and the notation of "E+n" means "$\times 10^{n}$". n represents an integer.

In the additive column, for example, the notation of "Surfactant 1 (13.3)" in Table 2 represents that the surfactant 1 is added and the HLB value of the surfactant is 13.3.

"<0.001" means less than 0.001.

The notation of "−" in the column in which the numerical value is described represents that the compound or the like is not added or the value cannot be calculated.

A to D, or A or B described in the columns of ER(SiGe), ERR(Si/SiGe), and defect suppressibility represents that those ER(SiGe), ERR(Si/SiGe), and defect suppressibility were evaluated according to the above-mentioned standards.

TABLE 1

| | Quaternary ammonium salt having hydroxyl group (A) | | Polar organic solvent 1 | | Polar organic solvent 2 | | Nitrogen-containing compound (8) | | | | Metal element (C) | | | | | | | Defect |
|---|---|---|---|---|---|---|---|---|---|---|---|---|---|---|---|---|---|---|
| | Type | Content | Type | Content | Type | Content | Type | Content | B/A | pH | Cr (ppb) | Fe (ppb) | Cu (ppb) | C/B | Additive | ER (SiGe) | ERR (Si/SiGe) | suppressibility |
| Example 1 | Dimethylbis(2-hydroxyethyl) ammonium hydroxide | 5.0% | DMSO | 25% | MEA | 20% | Hydrazine | 0.04% | 0.0080 | 13.8 | 10 | 110 | 1 | 3.0E−02 | — | A | A | A |
| Example 2 | Dimethylbis(2-hydroxyethyl) ammonium hydroxide | 5.0% | DMSO | 25% | Sulfolane | 20% | Hydrazine | 0.04% | 0.0080 | 13.9 | 15 | 90 | 3 | 2.7E−02 | — | A | B | A |
| Example 3 | Dimethylbis(2-hydroxyethyl) ammonium hydroxide | 5.0% | DMSO | 25% | — | — | Hydrazine | 0.04% | 0.0080 | 13.4 | 11 | 75 | 0.1 | 2.2E−02 | — | B | B | A |
| Example 4 | Dimethylbis(2-hydroxyethyl) ammonium hydroxide | 5.0% | DMSO | 10% | — | — | Hydrazine | 0.04% | 0.0080 | 13.2 | 20 | 144 | 0.5 | 4.1E−02 | — | C | B | A |
| Example 5 | Dimethylbis(2-hydroxyethyl) ammonium hydroxide | 5.0% | DMSO | 80% | — | — | Hydrazine | 0.04% | 0.0080 | 14.2 | 7 | 51 | 0.03 | 1.5E−02 | — | B | B | A |
| Example 6 | Dimethylbis(2-hydroxyethyl) ammonium hydroxide | 5.0% | DMSO | 90% | — | — | Hydrazine | 0.04% | 0.0080 | 14.3 | 3 | 98 | 0.2 | 2.5E−02 | — | B | C | A |
| Example 7 | Dimethylbis(2-hydroxyethyl) ammonium hydroxide | 5.0% | DMSO | 25% | MEA | 20% | Hydrazine<br>Trimethylamine | 0.04%<br>0.001% | 0.0082 | 13.8 | 0.1 | 16 | 0.04 | 3.9E−03 | — | A | A | A |
| Example 8 | Dimethylbis(2-hydroxyetbyl) ammonium hydroxide | 5.0% | MEA | 60% | — | — | Hydrazine<br>N,N-dimethylethanolamine | 0.04%<br>0.10% | 0.0280 | 14.4 | 4 | 55 | 0.9 | 4.3E−03 | — | A | B | A |
| Example 9 | Methyltris(2-hydroxyethyl) ammonium hydroxide | 4.5% | DMSO | 25% | MEA | 20% | N-methyldiethanolamine | 0.30% | 0.0667 | 13.7 | 0.9 | 44 | 0.3 | 1.5E−03 | — | A | A | A |
| Example 10 | Methyltris(2-hydroxyethyl) ammonium hydroxide | 4.5% | MEA | 60% | — | — | Hydrazine<br>N-methyldiethanolamine | 0.30%<br>0.04% | 0.0756 | 14.3 | 6 | 36 | 1.1 | 1.3E−03 | — | A | B | A |
| Example 11 | 4-Methyl-4-(2-hydroxyethyl) morpholinium hydroxide | 4.0% | DMSO | 25% | MEA | 20% | N-methylmorpholine | 0.30% | 0.0750 | 13.5 | 3 | 99 | 1 | 3.4E−03 | — | A | A | A |
| Example 12 | Oxydiethylenebis[dimethyl (2-hydroxyethyl) ammonium hydroxide) | 4.5% | DMSO | 25% | MEA | 20% | Bis(2-dimethylaminoethyl) ether | 0.30% | 0.0667 | 13.7 | 3 | 210 | 0.07 | 7.1E−03 | — | A | A | A |
| Example 13 | Dimethylbis(2-hydroxyethyl) ammonium hydroxide<br>Methyltris(2-hydroxyethyl) ammonium hydroxide | 2.5%<br>2.5% | DMSO | 25% | MEA | 20% | Hydrazine | 0.04% | 0.0080 | 13.8 | 9 | 32 | 2 | 1.1E−02 | — | A | A | A |
| Example 14 | Choline | 4.5% | DMSO | 25% | MEA | 20% | Trimethylamine | 0.001% | 0.00022 | 13.6 | 1 | 55 | 3 | 5.9E−01 | — | B | A | A |
| Example 15 | Choline | 3.0% | DMSO | 25% | MEA | 20% | Trimethylamine | 0.0002% | 0.00007 | 13.3 | 1 | 16 | 0.02 | 8.5E−01 | — | B | A | A |
| Example 16 | Choline | 4.5% | DMSO | 25% | MEA | 20% | Trimethylamine | 0.001% | 0.00022 | 13.6 | 150 | 1200 | 40 | 1.4E+01 | — | B | A | B |

TABLE 2

| | Quaternary ammonium salt having hydroxyl group (A) | | Polar organic solvent 1 | | Polar organic solvent 2 | | Nitrogen-containing compound (B) | | | | Metal element (C) | | | | | | | Defect sup- |
|---|---|---|---|---|---|---|---|---|---|---|---|---|---|---|---|---|---|---|
| | | | | | | | | | | | Cr | Fe | Cu | | | ER | ERR | pressi- |
| | Type | Content | Type | Content | Type | Content | Type | Content | B/A | pH | (ppb) | (ppb) | (ppb) | C/B | Additive | (SiGe) | (Si/SiGe) | bility |
| Example 17 | 4-Methyl-4-(2-hydroxyethyl) morpholinium hydroxide | 10.0% | DMSO | 25% | MEA | 20% | N-methylmorpholine | 1.00% | 0.10 | 14.3 | 0.03 | 0.1 | 0.008 | 1.4E−06 | — | A | A | A |
| Example 18 | 4-Methyl-4-(2-hydroxyethyl) morpholinium hydroxide | 12.0% | DMSO | 25% | MEA | 20% | N-methylmorpholine | 1.20% | 0.10 | 14.1 | 9 | 117 | 2 | 1.1E−03 | — | A | B | A |
| Example 19 | 4-Methyl-4-(2-hydroxyethyl) morpholinium hydroxide | 8.0% | DMSO | 25% | MEA | 20% | N-methylmorpholine | 0.70% | 0.0875 | 14.1 | <0.001 | <0.001 | <0.001 | <4.3E−08 | — | A | B | A |
| Example 20 | 4-Methyl-4-(2-hydroxyethyl) morpholinium hydroxide | 4.0% | DMSO | 25% | — | — | N-methylmorpholine | 0.30% | 0.0750 | 13.5 | 5 | 30 | 3 | 1.3E−03 | Corrosion inhibitor 1% | A | B | A |
| Example 21 | 4-Methyl-4-(2-hydroxyethyl) morpholinium hydroxide | 4.0% | DMSO | 25% | — | — | N-methylmorpholine | 0.30% | 0.0750 | 13.5 | 6 | 29.1 | 2.9 | 1.3E−03 | Surfactant 1 (13.3) 50 ppm | A | B | A |
| Example 22 | 4-Methyl-4-(2-hydroxyethyl) morpholinium hydroxide | 4.0% | DMSO | 25% | — | — | N-methylmorpholine | 0.30% | 0.0750 | 13.5 | 5.5 | 29.6 | 2.8 | 1.31−03 | Surfactant 2 (14.5) 50 ppm | A | B | A |
| Example 23 | 4-Methyl-4-(2-hydroxyethyl) morpholinium hydroxide | 4.0% | DMSO | 25% | — | — | N-methylmorpholine | 0.30% | 0.0750 | 13.5 | 5.1 | 29.3 | 2.9 | 1.2E−03 | Surfactant 3 (12.6) 50 ppm | A | B | A |
| Example 24 | 4-Methyl-4-(2-hydroxyethyl) morpholinium hydroxide | 4.0% | DMSO | 25% | — | — | N-methylmorpholine | 0.30% | 0.0750 | 13.5 | 5.3 | 29.4 | 2.8 | 1.3E−03 | Surfactant 4 (18.0) 50 ppm | A | B | B |
| Example 25 | 4-Methyl-4-(2-hydroxyethyl) morpholinium hydroxide | 4.0% | DMSO | 25% | — | — | N-methylmorpholine | 0.30% | 0.0750 | 13.5 | 5.7 | 29.6 | 2.7 | 1.3E−03 | Surfactant 5 (10.6) 50 ppm | A. | B | B |
| Example 26 | 4-Methyl-4-(2-hydroxyethyl) morpholinium hydroxide | 4,0% | DMSO | 25% | — | — | N-methylmorpholine | 0.30% | 0.0750 | 13.5 | 5.9 | 29.1 | 2.9 | 1.3E−03 | Surfactant 6 50 ppm | B | B | A |
| Example 27 | 4-Methyl-4-(2-hydroxyethyl) morpholinium hydroxide | 4.0% | DMSO | 25% | — | — | N-methylmorpholine | 0.30% | 0.0750 | 13.5 | 6.1 | 29.8 | 2.7 | 1.3.8−03 | Surfactant 7 50 ppm | B | B | A |
| Comparative Example 1 | TMAH | 5.0% | DMSO | 25% | — | — | Hydrazine | 0.04% | 0.0080 | 13.4 | 0.3 | 67 | 0.05 | 1.7E−02 | — | D | C | — |
| Comparative Example 2 | Dimethylbis(2-hydroxyethyl) ammonium hydroxide | 5.0% | DMSO | 10% | — | — | — | — | — | 13.2 | 1 | 119 | 2 | — | — | C | D | — |
| Comparative Example 3 | Dimethylbis(2-hydroxyethyl) ammonium hydroxide | 5.0% | — | — | — | — | Hydrazine | 0.04% | 0.0080 | 13.2 | 2 | 156 | 0.3 | 4.0E−02 | — | D | D | — |
| Comparative Example 4 | Dimethylbis(2-hydroxyethyl) ammonium hydroxide | 5.0% | DMSO | 25% | MEA | 20% | Hydrazine | 2.00% | 0.40 | 13.8 | 0.2 | 44 | 0.01 | 2.2E−04 | — | C | D | — |

From the results of Table 1 and Table 2, it has been confirmed from Examples and Comparative Examples that the composition exhibits suppressed etching of SiGe and has a large ratio of the etching rate of Si to the etching rate of SiGe.

From the comparison of Example 17 with Example 18, it has been confirmed that the effect of the present invention is more excellent in a case where the content of the nitrogen-containing compound is 0.0001% to 1.00% by mass with respect to the total mass of the composition.

From the comparison of Example 4 and Example 6 with Example 3 and Example 5, it has been confirmed that the effect of the present invention is more excellent in a case where the content of the polar organic solvent is 15% to 85% by mass with respect to the total mass of the composition.

From the comparison of Example 2, Example 3, and Example 7, it has been confirmed that the effect of the present invention is more excellent in a case where the composition contains two or more types of polar organic solvents.

From the comparison of Example 1 with Example 2, it has been confirmed that the effect of the present invention is more excellent in a case where the polar organic solvent has a hydroxyl group.

From the comparison of Example 1 with Example 14, it has been confirmed that etching of SiGe is further suppressed in a case where the ammonium cation in which $R^1$, $R^3$, and $R^4$ in Formula (3) are methyl groups and $R^2$ in Formula (3) is an ethylene group is not contained.

From the comparison of Example 16 and Example 19 with other Examples, it has been confirmed that the effect of the present invention is more excellent in a case where the ratio of the content of the metal component to the content of the nitrogen-containing compound is $1\times10^7$ to 1. Specifically, in Example 19, the ratio of the content of the metal component to the content of the nitrogen-containing compound is less than the lower limit thereof, so the evaluation of ERR(Si/SiGe) is "B", and in Example 16, the ratio of the content of the metal component to the content of the nitrogen-containing compound is more than the upper limit thereof, so the evaluation of defect suppressibility is "B". In Example 16, the evaluation of ER(SiGe) is "B", which is mainly due to the use of choline.

From the comparison of Example 21 to Example 23 with Example 24 to Example 27, it has been confirmed that the effect of the present invention is more excellent in a case where the composition contains a surfactant as an additive, and then in a case where the surfactant is a nonionic surfactant having an HLB value of 12.0 to 15.0.

What is claimed is:

1. A composition for treating a semiconductor, comprising:

a quaternary ammonium salt having a hydroxyl group;

a polar organic solvent;

at least one nitrogen-containing compound selected from the group consisting of a compound represented by Formula (1), a compound represented by Formula (2), and salts thereof; and water, wherein a mass ratio of the nitrogen-containing compound to the quaternary ammonium salt is 0.00001 to 0.10, and the quaternary ammonium salt includes an ammonium catin represented by Formula (3) or an ammonium cation represented by Formula (4), (1)

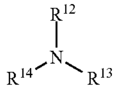

in Formula (1), $R^{12}$ represents an amino group or an alkyl group having 1 to 16 carbon atoms, $R^{13}$ and $R^{14}$ each independently represent a hydrogen atom or an alkyl group having 1 to 16 carbon atoms, and the alkyl group may have one or more groups selected from the group consisting of a hydroxyl group and an —O— group, and $R^{12}$ and $R^{13}$, $R^{13}$ and $R^{14}$, and $R^{12}$ and $R^{14}$ may be each independently bonded to each other to form a ring structure, (2)

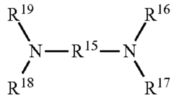

in Formula (2), $R^{15}$ represents an alkylene group having 1 to 16 carbon atoms which may have an —O— group, and $R^{16}$, $R^{17}$, $R^{18}$, and $R^{19}$ each independently represent an alkyl group having 1 to 16 carbon atoms, and the alkyl group may have one or more groups selected from the group consisting of a hydroxyl group and an —O— group, (3)

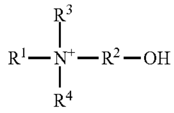

in Formula (3), $R^1$, $R^3$, and $R^4$ each independently represent an alkyl group having 1 to 16 carbon atoms, and the alkyl group may have one or more groups selected from the group consisting of a hydroxyl group and an —O— group, $R^2$ represents an alkylene group having 1 to 16 carbon atoms which may have an —O— group, and one of $R^1$ and $R^3$, $R^3$ and $R^4$, or $R^1$ and $R^4$ is bonded to another to form a ring structure, (4)

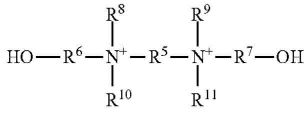

in Formula (4), $R^5$, $R^6$, and $R^7$ each independently represent an alkylene group having 1 to 16 carbon atoms which may have an —O— group, and $R^8$, $R^9$, $R^{10}$, and $R^{11}$ each independently represent an alkyl group having 1 to 16 carbon atoms, and the alkyl group may have one or more groups selected from the group consisting of a hydroxyl group and an —O— group.

2. The composition for treating a semiconductor according to claim 1, wherein a content of the nitrogen-containing compound is 0.0001% to 1.00% by mass with respect to a total mass of the composition for treating a semiconductor.

3. The composition for treating a semiconductor according to claim 1, wherein a content of the polar organic solvent is 15% to 85% by mass with respect to a total mass of the composition for treating a semiconductor.

4. The composition for treating a semiconductor according to claim 1, wherein the composition contains two or more types of the polar organic solvents.

5. The composition for treating a semiconductor according to claim 1, wherein the polar organic solvent has a hydroxyl group.

6. The composition for treating a semiconductor according to claim 1, wherein the quaternary ammonium salt does not include an ammonium cation in which $R^1$, $R^3$, and $R^4$ in Formula (3) are methyl groups and $R^2$ in Formula (3) is an ethylene group.

7. The composition for treating a semiconductor according to claim 1, further comprising:

a metal component containing at least one metal element selected from the group consisting of Cr, Fe, and Cu, wherein a content of the metal element is 1 ppt by mass to 1 ppm by mass with respect to a total mass of the composition for treating a semiconductor.

8. The composition for treating a semiconductor according to claim 7, wherein a ratio of the content of the metal element to a content of the nitrogen-containing compound is $1\times10^{-7}$ to 1.

9. The composition for treating a semiconductor according to claim 1, further comprising:

a surfactant.

10. The composition for treating a semiconductor according to claim 9, wherein the surfactant is a nonionic surfactant having an HLB value of 12.0 to 15.0.

11. The composition for treating a semiconductor according to claim 1, wherein the composition is used for treating an object to be treated containing silicon and silicon germanium.

12. A method for treating an object to be treated, comprising:

bringing an object to be treated containing silicon and silicon germanium into contact with the composition for treating a semiconductor according to claim 1 to remove the silicon.

13. The composition for treating a semiconductor according to claim 2, wherein a content of the polar organic solvent is 15% to 85% by mass with respect to a total mass of the composition for treating a semiconductor.

14. The composition for treating a semiconductor according to claim 2, wherein the composition contains two or more types of the polar organic solvents.

15. The composition for treating a semiconductor according to claim 2, wherein the polar organic solvent has a hydroxyl group.

16. A composition for treating a semiconductor, comprising:

a quaternary ammonium salt having a hydroxyl group;

a polar organic solvent;

at least one nitrogen-containing compound selected from the group consisting of a compound represented by Formula (1), a compound represented by Formula (2), and salts thereof; and water, wherein the composition has a pH of 11.0 or more, and a mass ratio of the nitrogen-containing compound to the quaternary ammonium salt is 0.00001 to 0.10,

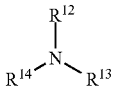

(1)

in Formula (1), $R^{12}$ represents an amino group or an alkyl group having 1 to 16 carbon atoms, $R^{13}$ and $R^{14}$ each independently represent a hydrogen atom or an alkyl group having 1 to 16 carbon atoms, and the alkyl group may have one or more groups selected from the group consisting of a hydroxyl group and an —O— group, and $R^{12}$ and $R^{13}$, $R^{13}$ and $R^{14}$, and $R^{12}$ and $R^{14}$ may be each independently bonded to each other to form a ring structure,

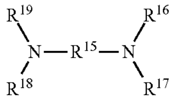

(2)

in Formula (2), $R^{15}$ represents an alkylene group having 1 to 16 carbon atoms which may have an —O— group, and $R^{16}$, $R^{17}$, $R^{18}$, and $R^{19}$ each independently represent an alkyl group having 1 to 16 carbon atoms, and the alkyl group may have one or more groups selected from the group consisting of a hydroxyl group and an —O— group.

17. A composition for treating a semiconductor, comprising:

a quaternary ammonium salt having a hydroxyl group;

a polar organic solvent;

at least one nitrogen-containing compound selected from the group consisting of a compound represented by Formula (1), a compound represented by Formula (2), and salts thereof; and water, wherein a mass ratio of the nitrogen-containing compound to the quaternary ammonium salt is 0.00001 to 0.10, and the quaternary ammonium salt includes at least one or more selected from the group consisting of dimethylbis (2-hydroxyethyl) ammonium hydroxide, methyltris (2-hydroxyethyl) ammonium hydroxide, 4-methyl-4-(2-hydroxyethyl) morpholinium hydroxide, and oxydiethylenebis [dimethyl (2-hydroxyethyl) ammonium hydroxide],

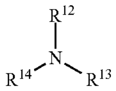

(1)

in Formula (1), R12 represents an amino group or an alkyl group having 1 to 16 carbon atoms, $R^{13}$ and $R^{14}$ each independently represent a hydrogen atom or an alkyl group having 1 to 16 carbon atoms, and the alkyl group may have one or more groups selected from the group consisting of a hydroxyl group and an —O— group, and $R^{12}$ and $R^{13}$, $R^{13}$ and $R^{14}$, and $R^{12}$ and $R^{14}$ may be each independently bonded to each other to form a ring structure,

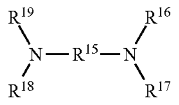

(2)

in Formula (2), $R^{15}$ represents an alkylene group having 1 to 16 carbon atoms which may have an —O— group, and $R^{16}$,$R^{17}$, $R^{18}$, and $R^{19}$ each independently represent an alkyl group having 1 to 16 carbon atoms, and the alkyl group may have one or more groups selected from the group consisting of a hydroxyl group and an—O— group.

* * * * *